Nov. 29, 1955 W. F. SANDS 2,725,466

HIGH GAIN TUNED LOOP ANTENNA CIRCUIT

Filed April 22, 1950

INVENTOR
WILLIAM F. SANDS
BY H. G. Newton
ATTORNEY 2,725,466

HIGH GAIN TUNED LOOP ANTENNA CIRCUIT

William F. Sands, Haddonfield, N. J., assignor to Radio Corporation of America, a corporation of Delaware Application April 22, 1950, Serial No. 157,599

15 Claims. (Cl. 250—20)

This invention relates generally to signal selecting circuits for radio receivers. In particular it relates to tunable loop antenna systems.

Conventionally, a loop antenna for a broadcast receiver is tuned by a shunted variable capacitor. This type of capacitively tuned circuit used in connection with loop antennas has certain disadvantages. Thus, in order to obtain a desired wide tuning range to cover the present broadcast band, for example, the tuning capacitor must have a large capacity value at the low frequency end of the tuning range. As a result, the total impedance of the tuned circuit at that frequency is low. This in turn reduces the sensitivity of the antenna circuit and the signal strength in the receiver at the low end of the tuning range. In addition, as the signal strength falls off, the signal-to-noise ratio becomes poor.

Many antenna circuits have been designed to overcome the above and other disadvantages. However, in most instances, the sensitivity of the loop antenna circuit has been decreased by the use of these circuits. In addition, many of the resulting circuits have not been adaptable for use with high inductance loop antennas as is desirable. Since the signal pick-up is dependent upon the inductance of the antenna loop, the use of a low inductance loop results in reduced sensitivity of the antenna circuit. Therefore, the use of a high inductance loop is more generally desirable.

As is well known in the antenna art, the inductance of the loop depends upon the area enclosed and the number of turns. To secure maximum signal voltage pick-up, the effective height ($h_e$) of the loop and the Q (defined as the ratio of reactance to resistance) should both be high. The effective height depends upon the loop inductance and therefore may be increased either by enlarging the area bounded by the loop turns, or by increasing the number of turns. Both these expedients, however, in increasing the loop inductance make it more difficult to tune the loop over a desired wide frequency range. It becomes even more difficult to cover a wide tuning range if circuit improvements provide for inserting additional inductances in the antenna tuning circuit. In those cases, an even larger tuning capacitor is necessary and the signal loss is, as a result, even more noticeable at the low frequency end of the tuning range.

Additional loading inductances also contribute resistive losses which greatly lower the circuit Q to the further detriment of the signal voltage pick-up and transfer to the receiving system. It is desirable therefore, from this standpoint, to use a variable capacitor for tuning to provide a high circuit Q, since the resistive losses of a capacitor are generally negligible.

It is therefore an object of the invention to provide a high gain tuned loop antenna curcuit which functions in an improved manner, yet which is tunable by means of a capacitive impedance.

Another object of the invention is to provide an antenna tuning system which operates to provide increased signal voltage transfer from the antenna to a radio receiver system or the like.

Another object of the invention is to provide an antenna tuning means which has a tuning range sufficiently broad to fully cover the broadcast range of 530 to 1610 kilocycles with a high degree of efficiency.

A further object of the invention is to provide an inexpensive antenna tuning circuit which has a high Q, a good effective height, and a nearly constant sensitivity over a relatively wide tuning range.

A still further object of the invention is to provide an antenna tuning system which may be used with a high inductance loop and which is tuned by means of a capacitive reactance, thereby giving increased signal energy transfer.

In accordance with the present invention, there is provided a loop antenna which is tuned by a variable capacitor or other similar variable impedance circuit. A series resonant circuit is then used to couple the tuned antenna circuit and a receiver input or other signal utilization circuit. To maintain the frequency of the coupling circuit resonant at the optimum gain value for incoming signals of all frequencies within the tuning range, it is variably tuned in unison with the variable capacitor.

The novel features which are considered characteristic of this invention are set forth with particularity in the appended claims. The invention itself, however, both as to its organization and its mode of operation as well as additional objects and advantages will best be understood from the following description when considered in connection with the accompanying drawing. The features of the invention which are considered novel are defined in the appended claims.

Figures 1, 2, 3, 4, 5:
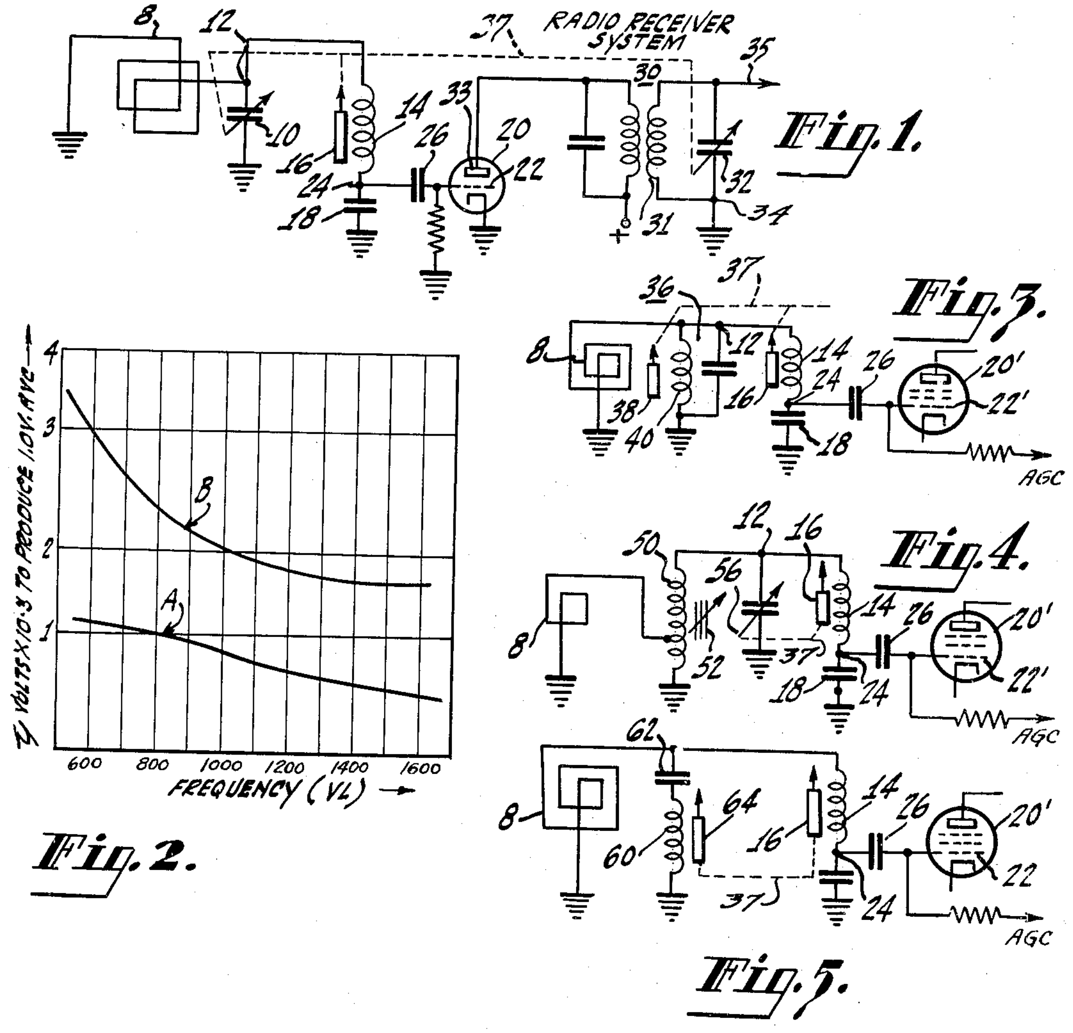
Figure 1 is a circuit diagram of a variably tuned radio receiver antenna system and input circuit embodying the present invention.
Figure 2 is a graph showing a representation of the operational characteristics of a circuit in accordance with the present invention as compared with conventional circuits of the prior art.
Figures 3, 4 and 5 are circuit diagrams of further receiver antenna systems and input circuit embodiments providing a high gain tuned loop antenna circuit in accordance with the invention, being modifications of the circuit of Figure 1.

Referring now to the drawing, in which like reference characters represent like parts throughout the respective views, and in particular to Figure 1, there is shown a grounded antenna loop 8 which is tuned by means of a variable capacitor 10 connected in shunt or parallel therewith. An antenna output terminal 12 is provided, and a coupling circuit is connected from this terminal to the input circuit of a radio receiver or other utilization means. The receiver input circuit is in this embodiment a series resonant circuit comprising an inductance 14, which is made variable by means of a movable core or similar tuning element 16, and a series receiver input capacitor 18 connected to ground on one side and to the inductance on the other in a series resonant coupling circuit between the terminal 12 and ground. Preferably the input capacitor 18 is of a small value so that it will present a high impedance to the receiver input circuit. However, as will be later described, the capacitor will inherently present a high impedance when used in accordance with this invention.

The receiver circuit, by way of example, is shown with a radio-frequency amplifier input stage including an electronic amplifier tube such as the triode 20. The triode 20 has its grid or control electrode 22 connected to the mid-point 24 of the series resonant coupling circuit by means of a direct current blocking capacitor 26.

There is shown a further variably tunable R.-F. amplifier circuit stage 30 connected to the anode 33 of the amplifier tube 20 and tuned by means of a variable capacitor 32 connected across the secondary 31 of an R.-F. coupling transformer. This transformer may be coupled to any receiver circuit of the many types known to those skilled in the art, by means of output leads 34 and 35 connected to the transformer secondary winding 31.

A mechanical linkage 37 or other unitary tuning control means (shown by means of a dotted line connecting the variable tuning elements 10, 16 and 32) is provided to effect variable tuning of the respective resonant circuits in unison.

In a series resonant coupling circuit, the voltages across the capacitor and the inductance will both be very much greater than voltage applied across the entire circuit, when the natural resonant frequency of the circuit is in the vicinity of the frequency of the applied voltage. This is possible because of voltages across the capacitor and inductance are then nearly 180 degrees out of phase with each other and so add up to a value that is much smaller than either voltage taken alone. Since the current in such a circuit at resonance is equal to the ratio of voltage to resistance (E/R), the voltage across the capacitor at resonance is equal to $E/wCR$ or EQ, where C is the capacitance and $w$ is $2\pi$ times the resonant frequency. This equation shows that at resonance, the voltage across the capacitor is Q times the applied voltage, which in this case is the voltage at the tuned antenna circuit output terminal 12, so that as a result, there is an increased voltage applied to the receiver input circuit. When the Q of a series resonant circuit, which may be expected to have a value at least in the neighborhood of 100, is high, a high voltage will be developed even with a very small applied potential.

Accordingly, the input capacitor 18 presents a very high impedance to the grid circuit of the amplifier tube 20, particularly at the low frequency end of the tuning range, and contributes to the increased gain of the antenna tuning circuit.

Although inductive input reactance may be used for the amplifier tube 20, capacitive input is preferred in accordance with the invention. This is due in part to the nature of the tube load, which of itself is capacitive. It is further found that the resonant frequency of the series coupling circuit is preferably adjusted slightly higher than the signal frequency. When this is done the capacitive reactance across the input capacitor 18 is larger than the inductive reactance across the coupling inductor 14. A higher input impedance is thereby maintained. In addition a more constant signal transfer throughout the entire tuning range is possible with the capacitor input. As the frequency becomes lower the reactance of an inductor becomes lower and the circuit gain falls off. The capacitor, however, affords a desirable higher reactance at the lower signal frequencies.

It is therefore seen that with the described circuit, the voltage available at the receiver input circuit will be much higher than that available at the antenna input terminal, providing the series resonant coupling circuit is maintained at optimum adjustment for each desired input signal frequency. This results in improved sensitivity. By means of the variable tuning element 16, the series coupling inductor 14 is varied simultaneously with the receiver tuning so that the maximum voltage gain is obtained over the entire receiver tuning range.

By making only the inductor of the series coupling circuit variable, the series coupling capacitor 18 remains at a small fixed value and the input impedance of the receiver, which is dependent upon the value of this capacitor, remains high in value. There will actually be a slight decrease in input impedance as the frequency increases. However, this is desirable to some extent since it is in the proper direction to compensate for the inherent increase in antenna effective height as the signal input frequency increases. It is therefore possible with the described circuit to get in addition to the large signal voltage, an essentially constant input signal transfer between the antenna and the receiver across the entire tuning range.

The increased gain which is nearly constant over the entire tuning range, as made possible by the teaching of this invention, is illustrated graphically in Figure 2. The curve A represents microvolts of field strength necessary to provide one volt of automatic volume control output in a receiver using the presently described antenna input. Curve B is representative of the sensitivity of the same receiver on the same scale when used with a conventional antenna input circuit comprising a loop and a shunted variable capacitor.

From the consideration of these curves, it is readily seen that the present invention provides a means of obtaining a nearly constant sensitivity over the entire receiver tuning range, whereas a conventional tuned loop provides a very low sensitivity at the lower end of the tuning range, and a lower overall sensitivity.

In an antenna input circuit embodying the invention which was set up and tested to derive the improved results as evidenced by curve A, the antenna loop had 28 turns. A universal progressive winding 1½ inches long on a .22 inch outer diameter coil form was used as the variable inductance 14. The tuning element 16 was a ferrite core having an outer diameter of .196 inch. The ferrite core 16 was made of one of the suitable high effective permeability, high Q materials such as Molybdenum Permalloy, or one of the ceramic type ferromagnetic materials characterized generally as "Ferrites." The input coupling capacitor 18 of the series resonant circuit has 17–20 mmf. capacity and the variable capacitor 10 had a range of 10 to 350 mmf. capacity.

The conventional variable-capacitor-tuned loop circuit used as a means of comparison, with a characteristic indicated by the curve B, had a loop of the same area. There were only 22 turns in the loop, however, in order to permit tuning over the entire frequency range with the same variable capacitor. In this case, the same receiver input circuit was connected directly to the antenna circuit output terminal 12 without the series resonant coupling circuit.

It is evident from a consideration of the foregoing description that, an antenna input circuit embodying the invention, not only gives increased sensitivity but provides a nearly constant output signal value over a relatively wide tuning range. These results are accomplished with a minimum of additional circuit constants. It is to be noted in particular that the loop inductance may have a much larger value in tuning over the same frequency range when the circuit of this invention is used. This in turn contributes to the increase in signal energy transfer to the utilization circuit.

Although a presently preferred embodiment of the invention is shown in Figure 1, there are modifications for variably tuning a loop antenna which are in accordance with the present invention. Some of these modifications are illustrated in Figures 3, 4 and 5. In the circuits shown, each of the antenna tuning means presents a capacitive impedance. The antenna is tuned to resonance by means of a tunable circuit which is independent of the means for tuning the associated series resonant coupling circuit. In other words, neither the series coupling circuit nor the capacitor 18 contained therein contribute capacitively to the tuning of the antenna other than by reflecting a small amount of capacitive reactance into the antenna circuit. It is also to be noted that although the use of additional inductances may appear to be desirable, in many cases it will lower the Q and therefore the overall gain of the antenna circuit. This is true because the inductive winding may introduce a substantial amount of resistive losses.

In Figure 3, the antenna loop 8 is tuned to resonance by means of a variably adjustable parallel antenna tuning tank circuit 36. This circuit is variably tunable by means of a variable or movable tuning element or core 38 connected to vary the inductance of the tank circuit inductor 40. This tuning means is ganged by a mechanical linkage 37 to the series resonant coupling circuit tuning means in the same manner as described above. The antenna output voltage at the terminal 12 in this circuit is comparable with that of the previously described circuit. Exact resonance at the signal frequency is not maintained in the antenna tuning tank circuit 36, however, since it must present a capacitive impedance to the loop 8 in order to resonate it to the signal frequency. As is well known in the art, if the inherent resonant frequency in the tank circuit is maintained at a value lower than that of the incoming signal frequency, the tank circuit will appear as a capacitance from the direction of the antenna. The circuit is therefore maintained at a natural resonant frequency slightly below the desired signal input frequency, thereby presenting a variable capacitive impedance.

A series resonant coupling circuit of the type described is also shown connected to the antenna loop output terminal 12 in the circuit diagrams of Figures 4 and 5. In these circuits and in Figure 3, the radio frequency amplifier stage is shown as a pentode electronic tube 20' rather than a triode. In addition an AGC (automatic gain control) voltage circuit is connected to the control electrode 22' of the pentode 20' along with the signal input circuit which is connected to the terminal 24 by means of a coupling or direct current blocking capacitor 26.

The invention may also be adapted for use with low impedance loop antennas in the manner shown in Figure 4. An input impedance matching transformer 50 is then provided, which may be of the auto transformer type having a variable adjusting element or core 52 for effecting the proper impedance matching when the low impedance loop 8' is connected across a fixed portion 54 of the transformer 50. Tuning of a loop circuit of this type may be effected by means of a variable capacitor 56 connected in shunt with the impedance matching transformer 50. As explained above, the circuit constants of the resulting parallel tank antenna tuning circuit are adjusted to a value such that the natural resonant frequency is lower than that of the incoming signal, to provide a variable capacitive antenna tuning impedance.

The antenna loop, as shown in Figure 5, may also be tuned by means of a series circuit, comprising an inductor 60 and capacitor 62, connected in shunt with the antenna loop 8. Tuning of the series circuit may be effected by means of a variably movable tuning element or core 64 associated with the associated inductor 60. As in the embodiments previously described, this tuning means is varied in unison with the tuning element 16 of the variable frequency coupling circuit. In order to present a capacitive impedance to the loop 8, the series resonant inductor 60 and capacitor 62 have a natural resonant frequency slightly higher than that of the incoming signal.

The invention therefore provides an improved receiver input tuning circuit using a loop antenna and affording a high gain signal transfer network. The invention is characterized in that a series resonant coupling circuit is used in combination with a capacitively tuned antenna circuit. Tuning of the circuits in unison provides improved gain, an almost constant gain versus frequency response, and a tuning range over a broad band of frequencies.

Having thus completely described the nature, construction, and manner of operation of the invention, the features of novelty are described in the appended claims.

What is claimed is:

1. A high gain tuned antenna system comprising in combination, a loop antenna, an essentially capacitive tuning means connected to said antenna, means for adjusting said capacitive tuning means for tuning said loop to a predetermined signal frequency in a predetermined band of signal frequencies, a receiver input coupling circuit connected in shunt with said loop including a series tuning inductor and high impedance capacitor means tuned to series resonance at substantially said predetermined frequency, means for variably adjusting the impedance of said tuning inductor, and means for variably adjusting said capacitive tuning means and said series tuning inductor in unison and in predetermined relation.

2. An antenna system as defined in claim 1, wherein said capacitive tuning means for tuning said loop comprises a variably tuned parallel resonant circuit tuned to a natural resonant frequency below the resonant frequency of the receiver input coupling circuit.

3. A system as defined in claim 2, wherein said parallel resonant circuit is variably tuned by means of a movable tuning element associated with an inductor in said parallel circuit.

4. A system as defined in claim 1, wherein said capacitive means for tuning said loop comprises a variably tuned series resonant circuit tuned to a frequency above the resonant frequency of the receiver input coupling circuit.

5. A loop antenna tuning system comprising in combination, an inductor, a loop antenna effectively coupled across at least a portion of said inductor, a capacitive element coupled across said inductor to provide therewith a parallel-resonant circuit which presents an essentially capacitive impedance to said antenna, means for tuning said parallel-resonant circuit for a predetermined band of signal frequencies, a coupling circuit series resonant at a frequency higher than said signal frequency connected in shunt with said parallel resonant circuit comprising a second inductor and a second capacitive element, means for variably adjusting the impedance of said second inductor, means for varying the tuning of said resonant circuits in unison, and output circuit terminals connected across said second capacitive element, whereby substantially a constant high gain signal transfer may be attained in said system over an extended range of frequencies.

6. In combination, a loop antenna, means for tuning said loop to a predetermined signal frequency in a predetermined band of signal frequencies, said means comprising a variable reactance circuit having a capacitive reactance at said predetermined signal frequency connected with said loop, output terminals from said antenna, a coupling circuit series resonant at substantially said predetermined signal frequency including a capacitor and a variably tunable inductor connected across said terminals, means for connecting a signal utilization circuit across said capacitor, and means for variably tuning said inductor and said antenna in unison.

7. A combination as defined in claim 6, wherein said impedance network comprises a variable capacitor.

8. A combination as defined in claim 6, wherein said impedance network comprises a variably tunable parallel resonant circuit.

9. A combination as defined in claim 6, wherein said impedance network comprises a variably tunable series resonant circuit.

10. A combination as defined in claim 6, wherein said impedance network comprises a parallel circuit having a natural resonant frequency below that of said series resonant circuit.

11. In combination, a loop antenna, a variable antenna tuning capacitor connected in shunt with said antenna and tunable over a predetermined band of signal frequencies, a coupling circuit comprising a variable inductor and series capacitor connected in shunt with said variable capacitor and tunable over a band of frequencies higher than said band of signal frequencies, means for connecting a utilization circuit to said series capacitor, and means for variably tuning said variable capacitor and said variable inductor in unison.

12. In combination, a loop antenna, a parallel-resonant circuit tunable over a predetermined band of signal frequencies shunting said antenna and presenting a capacitive reactance thereto, a series resonant coupling circuit comprising an inductor and capacitor shunting said antenna and tunable over a band of frequencies higher than said band of signal frequencies, means for connecting a utilization circuit to said series coupling circuit, and means for variably tuning said variable frequency parallel-resonant circuit and said variably tunable series resonant circuit in unison.

13. In combination, a loop antenna, a tuning means for said antenna comprising a variable-frequency series resonant circuit shunting said antenna and presenting a capacitive reactance thereto, a receiver input coupling circuit comprising a variable inductor and series capacitor shunting said antenna, means for connecting a utilization circuit to said series capacitor, and means for variably tuning said variable frequency series resonant circuit and said variable inductor in unison.

14. In combination, a loop antenna, means providing variable capacitor shunting said antenna to tune said antenna over a predetermined band of signal frequencies, a variable-frequency series-resonant coupling circuit having a variable inductor and a capacitor shunting said antenna tunable over a predetermined band of frequencies means for coupling a utilization circuit to said coupling circuit, and means for simultaneously effecting variable tuning of said antenna tuning means and said variable-frequency series-resonant coupling circuit.

15. A high gain tuned antenna system comprising in combination, a loop antenna, means for tuning said loop to a predetermined signal frequency in a predetermined band of signal frequencies, said means comprising a variable reactance circuit having a capacitive reactance at said predetermined resonant frequency connected with said loop, a receiver input coupling circuit connected in shunt with said loop including a series tuning inductor and high impedance capacitor means tuned to series resonance at substantially said predetermined frequency, means for variably adjusting the impedance of said tuning inductor, and means for deriving signals across said capacitor means as a high impedance coupling element.

References Cited in the file of this patent

UNITED STATES PATENTS

| | | |
|---|---|---|
| 1,697,133 | Nauwerk | Jan. 1, 1929 |
| 1,717,174 | Slaughter | June 11, 1929 |
| 1,730,577 | Kolster | Oct. 8, 1929 |
| 2,244,177 | Schaper | June 3, 1941 |
| 2,310,323 | Sharp | Feb. 3, 1943 |
| 2,312,211 | DeCola | Feb. 23, 1943 |
| 2,342,491 | Rankin | Feb. 22, 1944 |
| 2,415,427 | Hings | Feb. 11, 1947 |
| 2,589,745 | Stolze | Mar. 18, 1952 |

OTHER REFERENCES

"Increasing the Pickup of the Loop Receiver" by Griffin, Radio, May 1925, pages 31, 32 and 66.